(12) United States Patent  
Ohba (10) Patent No.: US 7,964,887 B2  
(45) Date of Patent: Jun. 21, 2011

(54) LIGHT EMITTING DEVICE (75) Inventor: Yasuo Ohba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/640,174

(22) Filed: Dec. 17, 2009

(65) Prior Publication Data  
US 2010/0090244 A1 Apr. 15, 2010

Related U.S. Application Data (60) Division of application No. 11/441,149, filed on May 26, 2006, now Pat. No. 7,638,809, which is a continuation of application No. PCT/JP06/30483, filed on Mar. 7, 2006.

(30) Foreign Application Priority Data

Mar. 14, 2005 (JP) ................................. 2005-071447  
Feb. 20, 2006 (JP) ................................. 2006-042797

(51) Int. Cl.  
H01L 33/00 (2010.01)

(52) U.S. Cl. ................ 257/98; 257/90; 257/94; 257/95; 257/96; 257/97; 257/E33.023; 257/E33.027; 257/E33.028

(58) Field of Classification Search ............. 257/90, 257/94–98, E33.023, 27–28  
See application file for complete search history.

(56) References Cited

U.S. PATENT DOCUMENTS 5,990,495 A 11/1999 Ohba  
6,586,874 B1 * 7/2003 Komoto et al. ............... 313/503  
2002/0139984 A1 10/2002 Sugawara et al.  
2003/0006409 A1 1/2003 Ohba  
2003/0080343 A1 5/2003 Tominaga  
2004/0183088 A1 9/2004 Denbaars et al.  
2004/0207998 A1 10/2004 Suehiro et al.

FOREIGN PATENT DOCUMENTS

EP 1 484 803 A1 8/2004  
JP 7-183576 7/1995

(Continued)

OTHER PUBLICATIONS

U.S. Appl. No. 12/400,236, filed Mar. 9, 2009, Katsuno et al.  
U.S. Appl. No. 12/400,396, filed Mar. 9, 2009, Katsuno, et al.  
C.H. Chen, et al., "Nitride-Based Cascade Near White Light-Emitting Diodes", IEEE Photonics Technology Letters, vol. 14, No. 7, Jul. 2002, pp. 908-910.

(Continued)

Primary Examiner — Kiesha R Bryant  
Assistant Examiner — Minchul Yang  
(74) Attorney, Agent, or Firm — Oblon, Spivak, McClelland, Maier & Neustadt, L.L.P.

(57) ABSTRACT

A light emitting device includes a transparent substrate having first and second surfaces, a semiconductor layer provided on the first surface, a first light emission layer provided on the semiconductor layer and emitting first ultraviolet light including a wavelength corresponding to an energy larger than a forbidden bandwidth of a semiconductor of the semiconductor layer, a second light emission layer provided between the first light emission layer and the semiconductor layer, absorbing the first ultraviolet light emitted from the first light emission layer, and emitting second ultraviolet light including a wavelength corresponding to an energy smaller than the forbidden bandwidth of the semiconductor of the semiconductor layer, and first and second electrodes provided to apply electric power to the first light emission layer.

4 Claims, 6 Drawing Sheets

FOREIGN PATENT DOCUMENTS

| | | |
|---|---|---|
| JP | 7-254732 | 10/1995 |
| JP | 2001-352098 | 12/2001 |
| JP | 2002-305327 | 10/2002 |
| JP | 2003-332619 | 11/2003 |
| JP | 2004-179644 | 6/2004 |
| JP | 2004-228464 | 8/2004 |
| JP | 2004-260111 | 9/2004 |
| JP | 2004-335716 | 11/2004 |
| WO | WO 97/48138 | 12/1997 |
| WO | WO 2005067068 A1 * | 7/2005 |

OTHER PUBLICATIONS

W.R. Chen, et al., "ZnSe-Based Mixed-Color LEDs", IEEE Photonics Technology Letters, vol. 16, No. 5, May 2004, pp. 1259-1261.

T. Nakamura, et al., "Novel Cladding Structure for ZnSe-Based White Light Emitting Diodes with Longer Lifetimes of over 10,000 h", Japanese Journal of Applied Physics, vol. 43, No. 4A, 2004, pp. 1287-1292, The Japan Society of Applied Physics 2004.

* cited by examiner

LIGHT EMITTING DEVICE

CROSS-REFERENCE TO RELATED APPLICATIONS

This application is a division of and claims the benefit of priority under 35 U.S.C. §120 from U.S. Ser. No. 11/441,149 filed May 26, 2006, which is a continuation application of PCT Application No. PCT/JP2006/304830 filed Mar. 7, 2006, which was published under PCT Article 21(2) in English, and claims the benefit of priority under 35 U.S.C. §119 from Japanese Patent Application Nos. 2005-071447 filed Mar. 14, 2005; and 2006-042797 filed Feb. 20, 2006, the entire contents of each of which are incorporated herein by reference.

BACKGROUND OF THE INVENTION

1. Field of the Invention

The present invention relates to a light emitting device using a nitride-based III-V group compound semiconductor or a light emitting device using a fluorescent substance.

2. Description of the Related Art

There has been attempted acquisition of white light based on emission of a plurality of types of lights having different peak wavelengths by using light emitting diodes (LEDs) formed of GaN and its mixed crystal in place of a conventional white fluorescent lamp (see, e.g., Jpn. Pat. Appln. KOKAI Publication No. 2001-352098). In this publication, an Si-doped GaN photoexcitation emission layer is excited by blue light generated in a multiple quantum well (MQW) light emission layer of a light emitting diode to generate yellow light, and the fact that these lights have a complementary color relationship is utilized, thereby obtaining white light. However, a red color cannot be generated in the light emitting device described in the above publication, color rendering of light is hence degraded, and it is hard to say that the light emitting device can sufficiently substitute for the conventional white fluorescent lamp.

In recent years, a white lamp obtained by determining an LED of GaN and its mixed crystal as an excitation source and combining the LED with a fluorescent substance has been utilized for illumination. However, there is a problem that efficiency and color rendering of the white lamp are inferior to those of a conventional fluorescent lamp using a mercury discharge tube. That is because a fluorescent substance used in this white lamp has a wide spectral width and low light emission efficiency. In particular, a most common cause is low light emitting efficiency of a red fluorescent substance.

In the conventional white fluorescent lamp, an oxide or the like in which a trivalent rare earth element Eu is added (e.g., $Y_2O_3:Eu^{3+}$) is used as the red fluorescent substance. This oxide having Eu added therein demonstrates red light emission with a very narrow wavelength distribution in the vicinity of 620 nm by an inner core transition inherent to the trivalent rare earth element Eu. Since the wavelength distribution is narrow, there is no loss due to light emission in a long-wavelength region where a luminosity factor is low, which greatly contributes to an improvement in efficiency and color rendering.

This inner core transition of the trivalent rare earth element Eu atom is a forbidden transition, and efficiency is drastically increased when excitation occurs by light having a short wavelength which is not greater than 350 nm. Therefore, when the LED formed of GaN and its mixed crystal is utilized, since a light emission wavelength of GaN is 365 nm, excitation must be performed with a wavelength shorter than this wavelength. However, in case of shortening the light emission wavelength, it can be considered that sufficient efficiency cannot be obtained due to, e.g., light absorption by GaN formed on a sapphire substrate or the like.

As described above, in case of exciting the red fluorescent substance by using the light emitting diode formed of a semiconductor such as GaN and its mixed crystal or the like, light emission efficiency of the red fluorescent substance is low. It can be considered that sufficient efficiency cannot be obtained due to light absorption or the like by the semiconductor such as GaN even if the light emission wavelength is shortened in order to improve the light emission efficiency. Therefore, the red fluorescent substance cannot be allowed to efficiently emit light by using the light emitting diode formed of a semiconductor such as GaN and its mixed crystal or the like. Further, it is difficult to realize a light emitting device having high efficiency and high color rendering by combining the red fluorescent substance with any other visible light fluorescent substance.

Therefore, there has been demanded realization of a light emitting device which allows the red fluorescent substance to efficiently emit light or a light emitting device using a light emitting diode and a fluorescent substance which is superior in efficiency and color rendering.

BRIEF SUMMARY OF THE INVENTION

According to the invention, there is provided a light emitting device, which comprises:

a transparent substrate having a first surface and a second surface;

a semiconductor layer provided on the first main surface of the transparent substrate;

a first light emission layer which is provided on the semiconductor layer and emits first ultraviolet light including a wavelength corresponding to an energy larger than a forbidden bandwidth of a semiconductor of the semiconductor layer;

a second light emission layer which is provided between the first light emission layer and the semiconductor layer, absorbs the first ultraviolet light emitted from the first light emission layer, and emits second ultraviolet light including a wavelength corresponding to an energy smaller than the forbidden bandwidth of the semiconductor of the semiconductor layer; and a first electrode and a second electrode provided in order to apply electric power to the first light emission layer.

DETAILED DESCRIPTION OF THE INVENTION

Embodiments according to the present invention will now be described hereinafter with reference to the accompanying drawings.

First Embodiment

Figure 1:
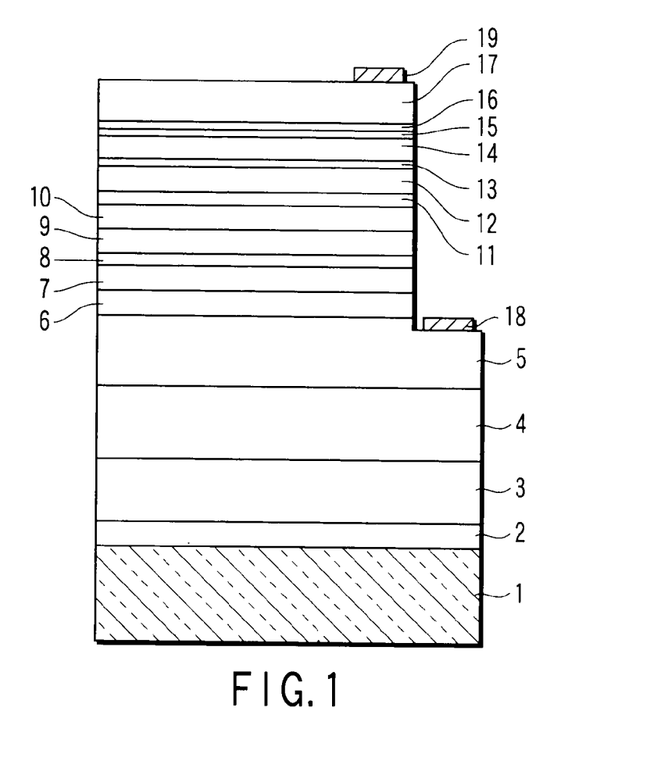
FIG. 1 is a cross-sectional view showing a configuration of a light emitting device according to a first embodiment of the present invention.

As shown in FIG. 1, a light emitting device according to this embodiment is a light emitting diode formed of a GaN-based compound semiconductor formed on a sapphire substrate. That is, a first AlN buffer layer 2 (carbon concentration: $3 \times 10^{18}$ to $5 \times 10^{20}/cm^3$, a film thickness: 3 to 20 nm) having a high carbon concentration, a high-purity second AlN buffer layer 3 (carbon concentration: $1 \times 10^{18}$ to $3 \times 10^{18}/cm^3$, film thickness: 2 μm), a non-doped GaN buffer layer 4 (film thickness: 3 μm), an Si-doped n type GaN contact layer 5 (Si concentration: $1 \times 10^{18}$ to $5 \times 10^{18}/cm^3$, film thickness: 2 to 5 μm) are sequentially laminated on a substrate 1 whose surface is a sapphire c surface.

Furthermore, on the Si-doped n type GaN contact layer 5 are sequentially laminated an Si-doped n type $Al_{0.05}Ga_{0.95}N$ first confinement layer 6 (Si concentration: $1 \times 10^{18}/cm^3$, film thickness: 20 nm), an Si-doped n type GaN first absorption layer 7 (Si concentration: $1 \times 10^{18}/cm^3$, film thickness: 100 nm), an Si-doped n type GaInN photo-excited near-ultraviolet emission layer 8 (Si concentration: $1 \times 10^{18}/cm^3$, film thickness: 3.5 nm, wavelength: 380 nm), an Si-doped n type GaN second absorption layer 9 (Si concentration: $1 \times 10^{18}/cm^3$, film thickness: 100 nm), an Si-doped n type $Al_{0.11}Ga_{0.89}N$ second confinement layer 10 (Si concentration: $1 \times 10^{18}/cm^3$, film thickness: 20 nm), an Si-doped n type $Al_{0.06}Ga_{0.94}N$ current-injected ultraviolet emission layer 11 (Si concentration: $1 \times 10^{18}/cm^3$, film thickness: 3.0 nm, wavelength: 345 nm), a non-doped $Al_{0.11}Ga_{0.89}N$ spacer layer 12 (film thickness: 20 nm), an Mg-doped p type $Al_{0.28}Ga_{0.72}N$ electron barrier layer 13 (Mg concentration: $1 \times 10^{19}/cm^3$, film thickness: 10 nm), an Mg-doped p type $Al_{0.11}Ga_{0.89}N$ contact layer 14 (Mg concentration: $1 \times 10^{19}/cm^3$, film thickness: 100 nm), a high-concentration Mg-doped p type $Al_{0.11}Ga_{0.89}N$ contact layer 15 (Mg concentration: $2 \times 10^{20}/cm^3$, film thickness: 20 nm), a high-concentration Si-doped n type $Al_{0.11}Ga_{0.89}N$ contact layer 16 (Si concentration: $1 \times 10^{20}/cm^3$, film thickness: 20 nm) and an Si-doped n type $Al_{0.11}Ga_{0.89}N$ contact layer 17 (Si concentration: $5 \times 10^{18}/cm^3$, film thickness: 100 nm).

An n-side electrode 18 constituted of a composite film obtained by sequentially depositing Ti (0.05 μm)/Pt (0.05 μm)/Au (1.0 μm) is formed on an upper surface of an exposed part of the Si-doped n type GaN contact layer 5. A p-side electrode 19 constituted of a composite film obtained by sequentially depositing Ti (0.05 μm)/Pt (0.05 μm)/Au (1.0 μm) is likewise formed on an upper surface of a part of the Si-doped n type $Al_{0.11}Ga_{0.89}N$ contact layer 17.

The first AlN buffer layer 2 having a high carbon concentration functions to alleviate a difference in crystal form from the substrate, and reduces screw dislocation in particular. Moreover, the high-purity second AlN buffer layer 3 has a surface flattened in an atomic level and is a layer which reduces a defect of the non-doped GaN buffer layer 4 which grows thereon, and it is preferable to increase a thickness of this layer 3 to be larger than 1 μm. Additionally, in order to avoid warpage due to strain, a thickness which is not greater than 4 μm is desirable. The high-purity second AlN buffer layer 3 is not restricted to AlN, and $Al_xGa_{1-x}N$ ($0.8 \leq x \leq 1$) may be adopted, which can compensate warpage of a wafer.

The non-doped GaN buffer layer 4 serves to reduce a defect by three-dimensional island-shaped growth on the high-purity second AlN buffer layer. In order to flatten the growth surface, an average film thickness of the non-doped GaN buffer layer 4 must be equal to or above 2 μm. In terms of reproducibility and a reduction in warpage, 4 to 10 μm is appropriate as a total film thickness of the non-doped GaN buffer layer 4.

In the light emitting device according to this embodiment, electrons are injected into the $Al_{0.06}Ga_{0.94}N$ ultraviolet emission layer 11 from the n type $Al_{0.11}Ga_{0.89}N$ second confinement layer 10, and holes are injected into the same from the Mg-doped p type $Al_{0.28}Ga_{0.72}N$ electron barrier layer 13 through the $Al_{0.11}Ga_{0.89}N$ spacer layer 12, and ultraviolet light having a wavelength of 345 nm is emitted from the $Al_{0.06}Ga_{0.94}N$ ultraviolet emission layer 11. The ultraviolet light emitted toward the p-side electrode 19 side is transmitted through the respective layers from the $Al_{0.11}Ga_{0.89}N$ spacer layer 12 to the Si-doped n type $Al_{0.11}Ga_{0.89}N$ contact layer 17 and efficiently discharged toward the outside. That is because a forbidden bandwidth of each of these layer is greater than an energy corresponding to the wavelength of the ultraviolet light to be emitted.

On the other hand, the ultraviolet light emitted toward the substrate 1 side is absorbed in the Si-doped n type GaN second absorption layer 9 and the Si-doped n type GaN first absorption layer 7, and generated electrons and holes are recombined in the Si-doped n type GaInN photo-excited near-ultraviolet emission layer 8, thereby emitting near-ultraviolet light of 380 nm. Since this light has an energy smaller than a forbidden bandwidth of GaN, it is efficiently taken out to the outside from the substrate 1 without being absorbed in the n type GaN contact layer 5, the non-doped GaN buffer layer 4 or the like. This light is also emitted toward the p-side electrode 19 side, efficiently transmitted through the respective layers from the Si-doped n type GaN second absorption layer 9 to the n type $Al_{0.11}Ga_{0.89}N$ contact layer 17 without being absorbed, and efficiently emitted to the outside.

As a total film thickness of the n type GaN first absorption layer 7 and the n type GaN second absorption layer, 0.1 to 0.3 μm is appropriate considering a trade-off of absorption efficiency and a loss of excitation carriers. In a structure where the absorbing portion and the light emitting portion are separated in this manner, a film thickness of the GaInN light emission layer can be reduced. When the film thickness is reduced in this manner, an influence of a piezoelectric field induced by strain can be alleviated, and a reduction in mobility of the carrier due to scattering of an alloy becomes considerable. As a result, a capturing speed to defect is reduced, thereby suppressing non-light-emission recombination due to a crystal defect. Therefore, high light emission efficiency can be obtained.

Figure 2:
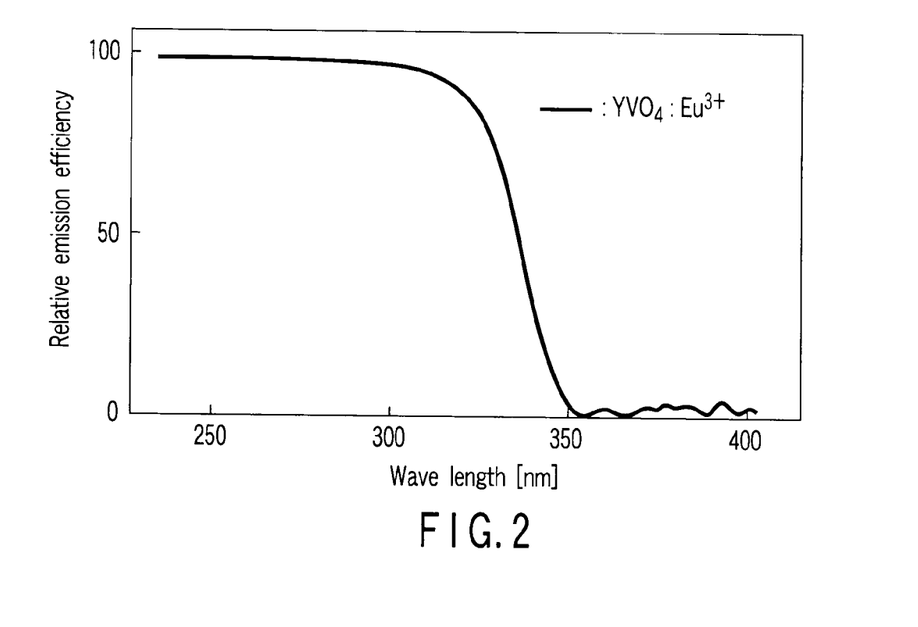
FIG. 2 is a characteristic view showing an excitation spectrum of $YVO_4:Er^{3+}$ which is a red fluorescent substance.

FIG. 2 is a characteristic view showing an excitation spectrum of $YVO_4:Eu^{3+}$ which is a red fluorescent substance for a typical high-pressure mercury vapor lamp. As shown in FIG. 2, when excitation is performed with light having a short wavelength which is not greater than 350 nm, light emission efficiency is suddenly increased. That is because an inner core transition of a trivalent rare earth element Eu atom is a forbidden transition and excitation to which an outer core level with a higher energy is related is required. According to the light emitting device of this embodiment, the ultraviolet light of 345 nm emitted toward the p-side electrode 19 side efficiently excites a fluorescent substance (e.g., $YVO_4:Eu^3$) having trivalent Eu as an emission center, and is converted into light having a narrow wavelength distribution of approximately 620 nm. That is, red visible light can be efficiently obtained by the ultraviolet light having a short wavelength which is not greater than 350 nm.

Additionally, the near-ultraviolet light of 380 nm generated in the Si-doped n type GaInN photo-excited near-ultraviolet emission layer 8 is emitted toward the substrate 1 side or the p-side electrode 19 side, and this light can be also effectively utilized. For example, this light can be utilized to excite a fluorescent substance which emits visible light other than red light, thereby efficiently obtaining the visible light other than the red light. Combining the light emitting device according to this embodiment with the red fluorescent substance or a fluorescent substance of any other color can acquire white light or lights having various colors. A white LED which generates white light will be described later.

Besides, according to the light emitting device of this embodiment, a tunnel junction is formed by the high-concentration Mg-doped p type $Al_{0.11}Ga_{0.89}N$ contact layer 15 and the high-concentration Si-doped n type $Al_{0.11}Ga_{0.89}N$ contact layer 16, and hence energization can be performed with a low voltage drop even under conditions of a reverse operation of a pn junction. Therefore, n type AlGaN having a low resistance and a high degree of transparency can be used as a contact layer and a current diffusion layer on the p-side electrode 19 side, thus realizing high efficiency and a low-voltage operation.

A manufacturing method of the light emitting device according to this embodiment will now be described. First, the sapphire substrate 1 is mounted on a susceptor which also serves as a heater of an MOCVD apparatus. There is introduced $2\times10^{-2}/m^3$ of high-purity hydrogen ($H_2$) gas in any one minute from a gas introducing tube to exchange atmospheric air in a reaction tube. Then, an inside pressure is set to a range of 10 to 30 kPa. Subsequently, the sapphire substrate 1 is heated in the hydrogen ($H_2$) gas so that its surface is cleaned.

Then, ammonia ($NH_3$) gas and trimethylaluminium ($Al(CH_3)_3$) vapor are introduced at a substrate temperature of 1150 to 1200° C. to allow the first AlN buffer layer 2 having a high carbon concentration to grow 3 to 20 nm. Here, in order to reduce a disorder of a crystal orientation of the first AlN buffer layer 2, control over a supply ratio (a V/III ratio) of a group-V element raw material and a group-III element raw material to the reaction tube is important. A V/III ratio range of 0.7 to 50 is required for growth of a high-quality film having no bore, and it is desirable to control the V/III ratio to fall within a range of 1.2 to 2.4 in order to obtain a sufficient quality with excellent reproducibility. Then, the substrate temperature is increased to 1250 to 1350° C., the high-purity second AlN buffer layer 3 is allowed to grow 1 to 2 μl, and its surface is flattened. For growth of the high-purity second AlN buffer layer 3, the V/III ratio is set to approximately 250 to 10000.

Further, the substrate temperature is set to 1150 to 1250° C. which is higher than a conventional GaN growth temperature, thereby allowing the non-doped GaN buffer layer 4 to grow. Thereafter, the growth temperature is lowered to 1100 to 1200° C., and monosilane ($SiH_4$) gas is added to allow the Si-doped n type GaN contact layer 5 to grow. When these respective layers which grow on the high-purity second AlN buffer layer 3 are allowed to grow, it is desirable to set the V/III ratio to a high ratio which is not smaller than 100.

Then, after the substrate temperature is set to 1000° C. to 1050° C., an element structure portion (the respective layers from the n type $Al_{0.05}Ga_{0.95}N$ first confinement layer 6 to the n type $Al_{0.11}Ga_{0.89}N$ contact layer 7) of the light emitting diode is allowed to grow. As a III-group raw material, there is used trimethylaluminum ($Al(CH_3)_3$), trimethylgallium ($Ga(CH_3)_3$), or trimethylindium ($In(CH_3)_3$). As a V-group raw material, ammonia ($NH_3$) gas is used. As an n type doping raw material, monosilane ($SiH_4$) gas is used. As a p type doping raw material, there is used a biscyclopentadienylmagnesium ($Cp_2Mg$) or bismethylcyclopentadienylmagnesium ($M_2Cp_2Mg$).

Then, each grown layer is selectively etched by reactive ion etching (RIE) so that the Si-doped n type GaN contact layer 5 is partially exposed, and an n-side electrode 18 constituted of a Ti/Pt/Au composite film is formed on a part of the exposed portion by a lift-off method. A p-side electrode 19 constituted of a Ti/Pt/Au composite film is also formed on a part of the Si-doped n type $Al_{0.11}Ga_{0.89}N$ contact layer 17 by the lift-off method. Then, cutting is performed by cleavage, a diamond blade or the like to obtain individual LED devices.

As described above, according to the manufacturing method of the light emitting device of this embodiment, a special post-process of eliminating the substrate and the GaN buffer layer does not have to be used, thereby producing a highly efficient ultraviolet light emitting diode with a high production yield at a low cost.

Meanwhile, as aforementioned, in the first embodiment, the ultraviolet light having the wavelength of 345 nm is emitted from the AlGaN ultraviolet emission layer 11, the ultraviolet light emitted toward the p-side electrode 19 side and the substrate 1 side is absorbed in the Si-doped n type GaN second absorption layer 9 and the Si-doped n type GaN first absorption layer 7 each having a forbidden bandwidth smaller than an energy of the ultraviolet light, and generated electrons and holes are recombined in the Si-doped n type GaInN near-ultraviolet emission layer 8, thereby emitting near-ultraviolet light of 380 nm. Since this near-ultraviolet light of 380 nm has an energy smaller than a forbidden bandwidth of GaN, it is efficiently taken out to the outside from the substrate 1 without being absorbed in the n type GaN contact layer 5, the non-doped GaN buffer layer 4 or the like and also emitted toward the p-side electrode 19 side.

However, the first embodiment is not restricted to the above-described combination, and it can be configured to emit near-ultraviolet light having a longer wavelength of, e.g., 370 nm from the upper first light emission layer 11 and emit near-ultraviolet light of, e.g., 380 nm from the second light emission layer 8 provided below the first light emission layer 11. That is, since the light emitted from the first light emission layer 11 mainly contains light having a wavelength corresponding to an energy close to the forbidden band of GaN but also contains light having a wavelength corresponding to an energy larger than the forbidden band of GaN, this light is absorbed in the GaN absorption layers 9 and 7, the light emission efficiency is lowered. However, this light is absorbed in the quantum well of the second light emission layer 8 and generated electrons and holes are recombined in the second light emission layer 8, thereby emitting the near-ultraviolet light of 380 nm.

Figure 3:
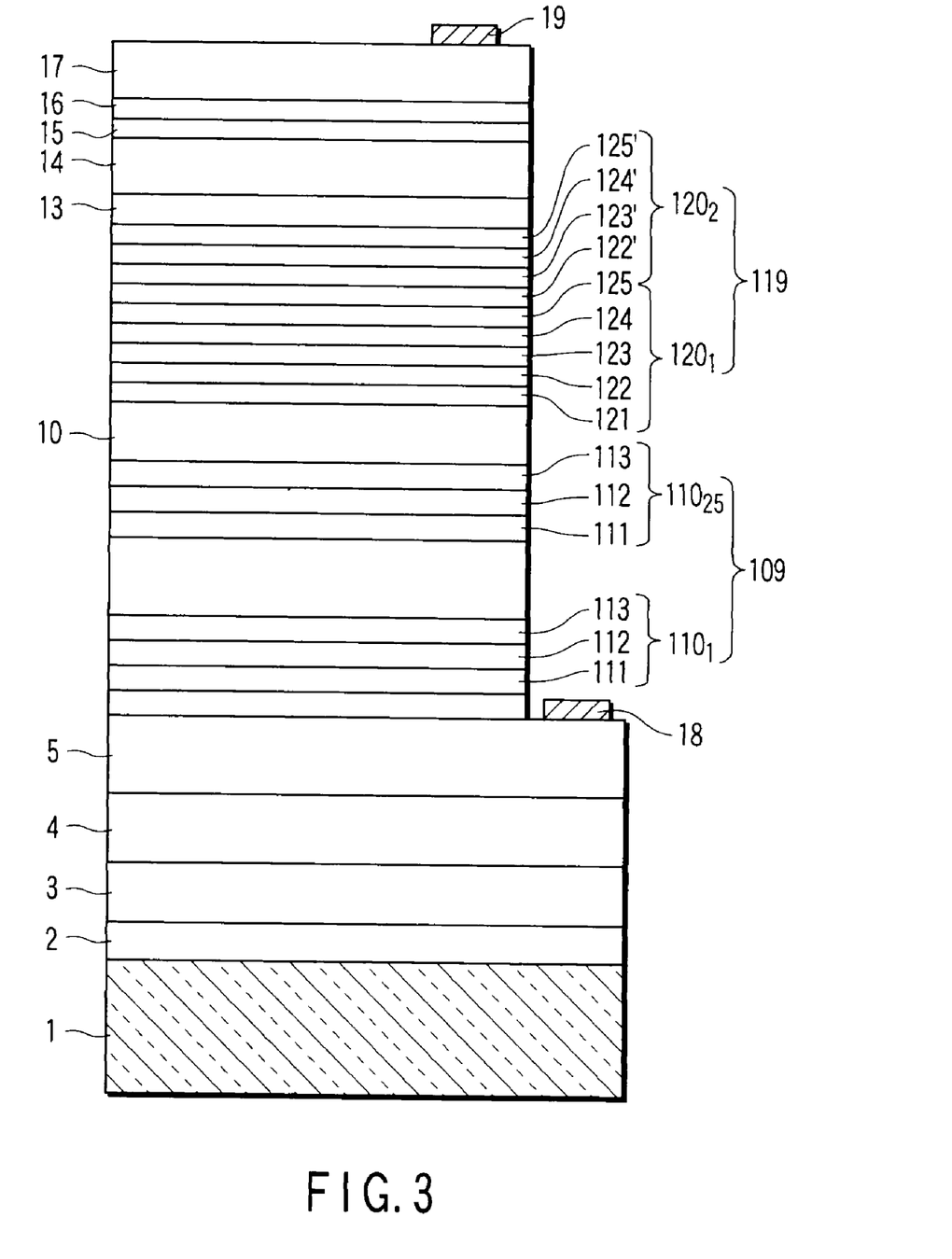
FIG. 3 is a cross-sectional view showing a configuration of a light emitting device according to a modification of the first embodiment.

FIG. 3 is a cross-sectional view of a light emitting device according to such a modification. In the drawing, like reference numerals denote parts equal to those in FIG. 1, thereby eliminating tautological explanation. Reference numerals 1 to 5 in a lower portion of the light emitting device are substantially the same as those in FIG. 1, and a first AlN single-crystal buffer layer 2 (film thickness: 5 nm) having a high carbon concentration, a high-purity second AlN buffer layer 3 (film thickness: 2 μm), a non-doped GaN buffer layer 4 (film thickness: 2 μm) and an Si-doped n type GaN contact layer 5 (film thickness: 3 μm) are sequentially laminated on a sapphire substrate 1. An n-side electrode 18 constituted of a composite film obtained by sequentially depositing Ti/Pt/Au is formed on an upper surface of an exposed part of the Si-doped n type GaN contact layer 5.

A second multiple quantum structure 109 (which will be described later) as characteristics of this modification is formed on the Si-doped n type GaN contact layer 5, and a first multiple quantum well structure 119 (which will be described later) is further formed thereon through an Si-doped n type AlGaN confinement layer 10 (Al composition: 15%, film thickness: 20 nm).

Furthermore, like the first embodiment, on this structure are sequentially laminated an Mg-doped p type AlGaN electron barrier layer 13 (Al composition: 35%, film thickness: 25 nm), an Mg-doped p type AlGaN contact layer 14 (Al composition: 2%, film thickness: 0.2 μm), a high-concentration Mg-doped p type AlGaN contact layer 15 (Al composition: 2%, film thickness: 10 nm), a high-concentration Si-doped n type AlGaN contact layer 16 (Al composition: 2%, film thickness: 10 nm) and an Si-doped n type AlGaN contact layer 17 (Al composition: 2%, film thickness: 1 μm). A p-side electrode 19 constituted of a composite film obtained by sequentially depositing Ti/Pt/Au is formed on an upper surface of a part of the Si-doped n type $Al_{0.11}Ga_{0.89}N$ contact layer 17.

The first and second multiple quantum well structures as characteristics of this modification will now be described. The first multiple quantum well structure 119 consisting of a plurality of current-injected near-ultraviolet emission layers $120_1$ and $120_2$ each having a wavelength of 370 nm is formed between the Si-doped n type AlGaN confinement layer 10 and the electron barrier layer 13. That is, an AlInGaN first barrier layer (Al composition: 7%, In composition: 0.5%, film thickness: 4 nm) 121 is formed on the Si-doped n type AlGaN confinement layer 10, and an Si-doped n type AlInGaN second barrier layer (Al composition: 7%, In composition: 0.5%, film thickness: 4 nm) 122, a first InGaN current-injected near-ultraviolet emission layer (In composition: 4%, film thickness: 4 nm, wavelength: 370 nm) 123, an Si-doped n type AlInGaN third barrier layer (Al composition: 7%, In composition: 0.5%, film thickness: 4 nm) 124 and an AlInGaN fourth barrier layer (Al composition: 7%, In composition: 0.5%, film thickness: 4 nm) 125 are sequentially formed thereon in the mentioned order.

Moreover, a fifth barrier layer 122' having the same configuration as the second barrier layer 122 is formed on this fourth barrier layer 125, a second InGaN current-injected near-ultraviolet emission layer (In composition: 4%, film thickness: 4 nm, wavelength: 370 nm) 123' is formed on the fifth barrier layer, and a sixth barrier layer 124' having the same configuration as the third barrier layer 124 and a seventh barrier layer 125' having the same configuration as the fourth barrier layer 125 are sequentially formed thereon in the mentioned order.

Although the second multiple quantum well structure 109 is formed between the Si-doped GaN contact layer 5 and the Si-doped n type AlGaN confinement layer 10, this is obtained by forming a photo-excited near-ultraviolet emission layer 110 having a wavelength 380 nm for 25 cycles.

The photo-excited near-ultraviolet emission layer 110 is constituted of an Si-doped n type AlInGaN eighth barrier layer (Al composition: 7%, In composition: 0.5%, film thickness: 4 nm) 111, an InGaN photo-excited near-ultraviolet emission layer (In composition: 5%, film thickness: 4 nm, wavelength: 380 mm) 112 and an Si-doped n type AlInGaN ninth barrier layer 113 (Al composition: 7%, In composition: 0.5%, film thickness: 4 nm). The first multiple quantum well structure 109 is obtained by repeatedly laminating this photo-exited near-ultraviolet emission layer 110 for 25 cycles.

As described above, according to the first embodiment, it is possible to realize a light emitting device which can emit ultraviolet light or near-ultraviolet light having two different wavelengths and is superior in color rendering.

Second Embodiment

Figure 4:
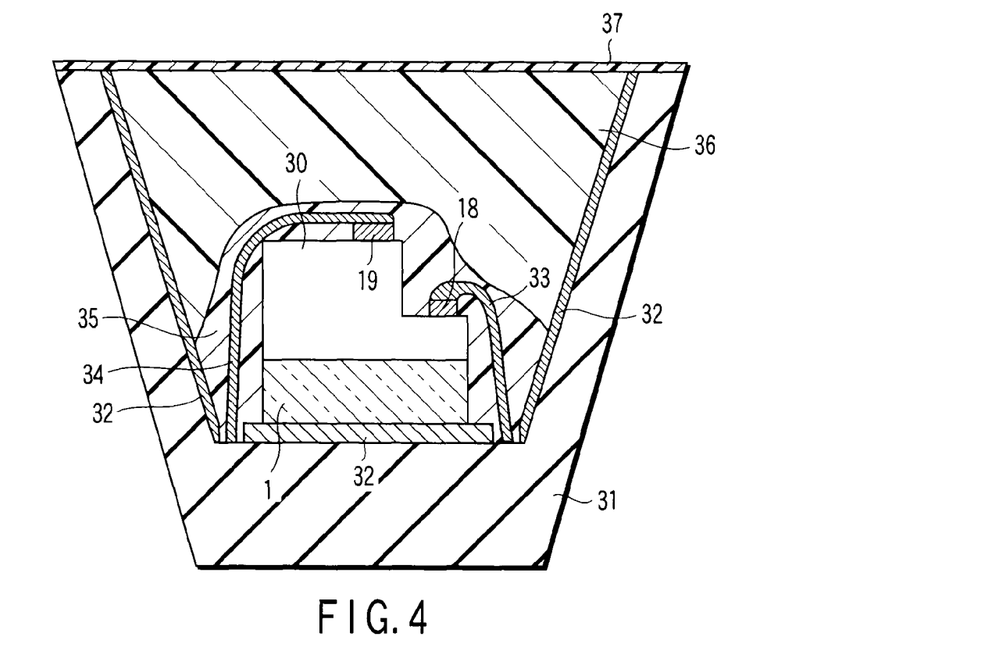
FIG. 4 is a cross-sectional view showing a configuration of a light emitting device according to a second embodiment of the present invention.

FIG. 4 is a cross-sectional view showing a configuration of a light emitting device according to a second embodiment of the present invention. Like reference numerals denote parts equal to those in FIG. 1. As shown in this drawing, the light emitting device according to this embodiment is a white LED obtained by combining a fluorescent substance with the light emitting diode shown in FIG. 1 according to the first embodiment. That is, as shown in FIG. 4, a reflection film 32 is provided on an inner surface of a package 31 formed of ceramics or the like, and the reflection film 32 is separately provided on an inner side surface and a bottom surface of the package 31. The reflection film 32 is formed of, e.g., aluminum. The light emitting diode shown in FIG. 1 is mounted on the reflection film 32 provided on the bottom surface of the package 31.

An n-side electrode 18 and a p-side electrode 19 are respectively connected with non-illustrated electrodes provided on the package 31 side through bonding wires 33 and 34 each formed of a gold alloy or the like. This connection is achieved at a part between the reflection film 32 on the inner side surface and the reflection film 32 on the bottom surface. Further, a fluorescent substance region 35 containing a red fluorescent substance is formed to cover the light emitting diode or the bonding wires 33 and 34, and a fluorescent substance region 36 containing a fluorescent substance of a blue color, a green color or a yellow color is formed on this fluorescent substance region 35. A lid portion 37 formed of a silicon resin is provided on this fluorescent substance region 36.

The fluorescent substance region 35 contains a resin and a red fluorescent substance dispersed in this resin. As the red fluorescent substance, it is possible to use, e.g., $Y_2O_3$ or $YVO_4$ as a base material, and trivalent Eu ($Eu^{3+}$) is contained in this material as an activator. That is, $YVO_4:Eu^{3+}$, $Y_2O_3:Eu^{3+}$ or the like can be used as the red fluorescent substance. A concentration of $Eu^{3+}$ is 1 to 10% in terms of a mol concentration. As a base material of the red fluorescent substance, it is possible to use LaOS, $Y_2(P,V)O_4$ or the like besides $Y_2O_3$ or $YVO_4$. Besides $Eu^{3+}$, $Mn^{4+}$ or the like can be also used. In particular, since absorption of 350 nm is increased by adding a small amount of Bi together with trivalent Eu to the $YVO_4$ base material, light emission efficiently can be further increased. Additionally, as the resin, a silicon resin or the like can be used.

Further, the fluorescent substance layer 36 contains a resin and a fluorescent substance of a blue color, a green color or a yellow color dispersed in this resin. The blue fluorescent substance may be combined with the green fluorescent substance, or the blue fluorescent substance may be combined with the yellow fluorescent substance, or the blue fluorescent substance, the green fluorescent substance and the yellow fluorescent substance may be combined and used.

As the blue fluorescent substance, for example, $(Sr, Ca)_{10}(PO_4)_6Cl_2:Eu^{2+}$, $BaMg_2Al_{16}O_{27}:Eu^{2+}$ or the like can be used. As the green fluorescent substance, it is possible to use, e.g., $Y_2SiO_5:Ce^{3+}$, $Tb^{3+}$ having trivalent Tb as an emission center. When an energy is transmitted from a Ce ion to a Tb ion, excitation efficiency is improved. Further, as the green fluorescent substance, it is possible to use, e.g., $Sr_4Al_{14}O_{25}:Eu^{2+}$ or the like. As the yellow fluorescent substance, it is possible to use, e.g., $Y_3Al_5:Ce^{3+}$ or the like. Furthermore, as the resin, a silicon resin or the like can be used. In particular, since trivalent Tb demonstrates keen light emission in the vicinity of 500 nm where a luminosity factor becomes maximum, light emission efficiency can be considerably improved when it is combined with keen light emission of trivalent Eu.

According to the light emitting device of this embodiment, the ultraviolet light of 345 nm emitted toward the p-side electrode 19 side efficiently excites the fluorescent substance having trivalent Eu or the like as the emission center which is contained in the fluorescent substance region 35, and is converted into light having a narrow wavelength distribution of approximately 620 nm. That is, red visible light can be efficiently obtained by the ultraviolet light having a short wavelength which is not greater than 350 mm.

Moreover, the near-ultraviolet light of 380 nm generated from the Si-doped n type GaInN near-ultraviolet emission layer 8 is emitted toward the substrate 1 side or the p-side electrode 19 side, and this light can be also effectively utilized by using reflection on the reflection film 32. That is, the fluorescent substance of blue, green or yellow contained in the fluorescent substance region 36 is efficiently excited by this near-ultraviolet light of 380 mm, thereby efficiently obtaining visible light of blue, green or yellow.

Therefore, the visible light of blue, green or yellow can be efficiently generated besides the red visible light, and white light or any other various color lights can be highly efficiently obtained with excellent color rendering as a result of mixing these lights.

A manufacturing method of the light emitting device according to this embodiment will now be described. A process of manufacturing the light emitting diode shown in FIG. 1 is the same as the process in the first embodiment. First, a metal film as a reflection film is formed on an inner surface of a package 31 by a sputtering method, and this metal film is patterned to leave a reflection film 32 on each of an inner side surface and a bottom surface of the package 31. Then, the light emitting diode (corresponding to 1, 30, 18 and 19 in FIG. 4) manufactured in the first embodiment is mounted and fixed on the reflection film 32 on the bottom surface of the package 31. For this fixation, bonding using an adhesive, soldering or the like can be adopted.

Then, an n-side electrode 18 and a p-side electrode 19 are respectively connected with non-illustrated electrodes provided on the package 31 side through bonding wires 33 and 34. Additionally, a fluorescent substance region 35 containing a red fluorescent substance is formed to cover the light emitting diode or the bonding wires 33 and 34, and a fluorescent substance region 36 containing a fluorescent substance of blue, green or yellow is formed on this fluorescent substance region 35. As a formation method of each of the fluorescent substance regions 35 and 36, a mixture in which each fluorescent substance is dispersed in a resin raw material mixture is dropped, and a heat treatment is carried out to effect thermal polymerization so that the resin is hardened. It is to be noted that the resin raw material compound liquid containing each fluorescent substance is dropped and left for a while, and then hardening is performed. As a result, fine particles of each fluorescent substance settle out so that the fine particles of each fluorescent substance can be localized in a lower layer of each of the fluorescent substance regions 35 and 36, thereby appropriately controlling light emission efficiency of each fluorescent substance. Then, a lid portion 37 is provided on the fluorescent substance region 36, thus manufacturing a white LED according to this embodiment.

Third Embodiment

Figure 5:
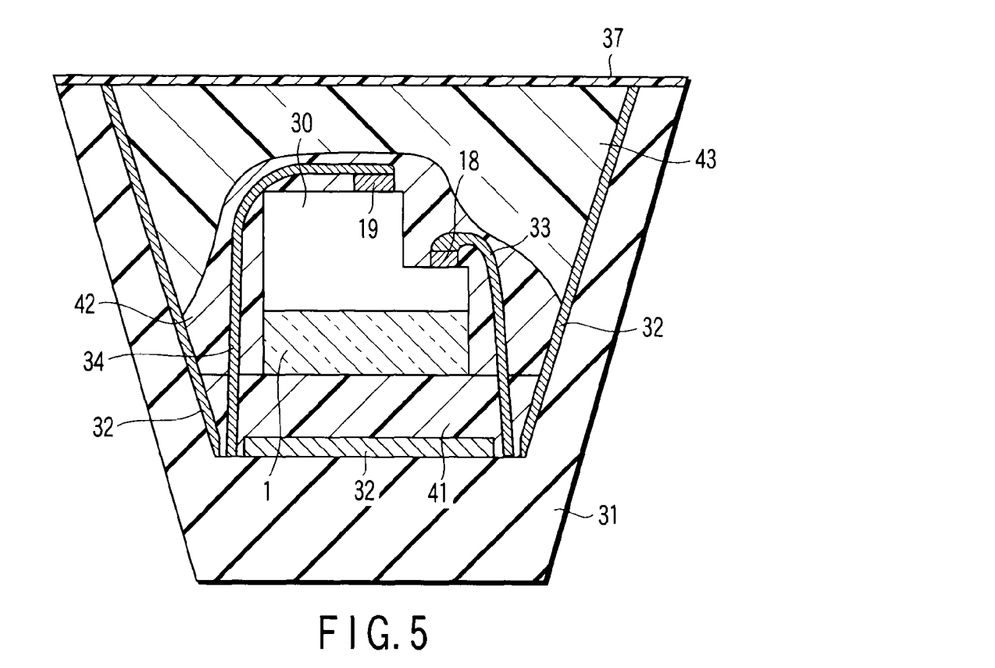
FIG. 5 is a cross-sectional view showing a configuration of a light emitting device according to a third embodiment of the present invention.

FIG. 5 is a cross-sectional view showing a configuration of a light emitting device according to a third embodiment of the present invention. Like reference numerals denote parts equal to those in FIGS. 1 and 4. As shown in FIG. 5, the light emitting device according to this embodiment is also a white LED obtained by combining a fluorescent substance with the light emitting diode shown in FIG. 1 according to the first embodiment. A difference from the second embodiment lies in that a fluorescent substance region is also arranged below the light emitting diode.

As shown in FIG. 5, a fluorescent substance region 41 containing a fluorescent substance of blue, green or yellow is formed on a reflection film 32 on a bottom surface of a package 31, and the light emitting diode shown in FIG. 1 is mounted and fixed on this fluorescent substance region 41. Bonding using an adhesive, soldering or the like can be utilized for fixation of this light emitting diode. An n-side electrode 18 and a p-side electrode 19 are respectively connected with non-illustrated electrodes provided on the package 31 side through bonding wires 33 and 34. The bonding wires 33 and 34 are respectively provided to pierce the fluorescent substance region 41. This connection is achieved at a part between the reflection film 32 on an inner side surface and the reflection film 32 on the bottom surface like the second embodiment. A fluorescent substance region 42 containing a red fluorescent substance is formed to cover the light emitting diode or the bonding wires 33 and 34, and a fluorescent substance region 43 containing a fluorescent substance of blue, green or yellow is formed on this fluorescent substance region 42.

According to the white LED of this embodiment, in addition to the effects obtained in the second embodiment, the following effects are demonstrated. That is, since the fluorescent substance region 41 is also provided below the light emitting diode, light emitted toward the substrate 1 side of near-ultraviolet light of 380 nm generated in the Si-doped n type GaInN photo-excited near-ultraviolet emission layer 8 of the light emitting diode also enters the fluorescent substance region 41, and hence a fluorescent substance in this fluorescent substance region 41 can be excited. Therefore, not only the light reflected by the reflection film 32 excites the fluorescent substance in the fluorescent substance region 43 to emit light, but also the fluorescent substance in the fluorescent substance region 41 can be excited to emit light. Therefore, light emission efficiency can be further improved. Furthermore, since this fluorescent substance region 41 is mainly irradiated with near-ultraviolet light of 380 nm to emit light having a color other than red, a color temperature can be independently adjusted, thereby further improving color rendering.

Fourth Embodiment

Figure 6:
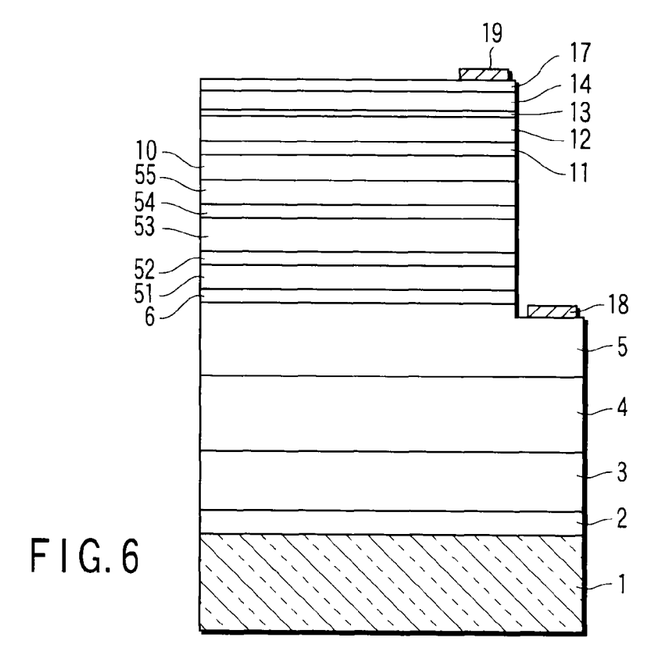
FIG. 6 is a cross-sectional view showing a configuration of a light emitting device according to a fourth embodiment of the present invention.

FIG. 6 is a cross-sectional view showing a configuration of a light emitting device according to a fourth embodiment of the present invention. Like reference numerals denote parts equal to those in FIG. 1. As shown in this drawing, the light emitting device according to this embodiment is a light emitting diode constituted of a GaN-based compound semiconductor formed on a sapphire substrate. A difference from the light emitting diode shown in FIG. 1 is configurations of a GaN absorption layer and a GaInN photo-excited near-ultraviolet emission layer.

As shown in FIG. 6, the GaN absorption layer and the GaInN photo-excited near-ultraviolet emission layer of the light emitting diode according to this embodiment are configured by sequentially laminating an Si-doped n type GaN first absorption layer 51 (Si concentration: $1\times10^{18}/cm^3$, film thickness: 50 nm), an Si-doped n type GaInN first photo-excited near-ultraviolet emission layer 52 (Si concentration: $1\times10^{18}/cm^3$, film thickness: 3 nm, wavelength: 380 nm), an Si-doped n type GaN second absorption layer 53 (Si concentration: $1\times10^{18}/cm^3$, film thickness: 100 nm), an Si-doped n type GaInN second photo-excited near-ultraviolet emission layer 54 (Si concentration: $1\times10^{18}/cm^3$, film thickness: 3 nm, wavelength: 380 nm) and an Si-doped n type GaN third absorption layer 55 (Si concentration: $1\times10^{18}/cm^3$, film thickness: 50 nm).

According to the light emitting diode of this embodiment, the same effects as those of the first embodiment can be obtained, and a white LED can be configured by combining this light emitting diode with a fluorescent substance like the second and third embodiments. Moreover, in the laminated configuration of the GaN absorption layer and the GaInN photo-excited near-ultraviolet emission layer, increasing the number of laminated absorption layers and photo-exited emission layers can reduce a film thickness of each layer while maintaining absorption efficiency of light emitted from a current-injected ultraviolet emission layer. Therefore, an influence of a defect can be reduced, thus providing the light emitting diode having excellent reliability and efficiency.

It is to be noted that, in this embodiment, an Mg-doped p type $Al_{0.11}Ga_{0.89}N$ contact layer 14 is directly in contact with an Si-doped n type $Al_{0.11}Ga_{0.89}N$ contact layer 17, and a high-concentration Mg-doped p type $Al_{0.11}Ga_{0.89}N$ contact layer 15 and a high-concentration Si-doped n type $Al_{0.11}Ga_{0.89}N$ contact layer 16 are not interposed between these layers. A configuration in which these contact layers 15 and 16 exist is a desirable configuration since a resistance can be effectively reduced. However, the contact layers 15 and 16 can be eliminated by increasing concentrations of the contact layers 14 and 17 as required in accordance with a demanded resistance value.

Fifth Embodiment

Figure 7:
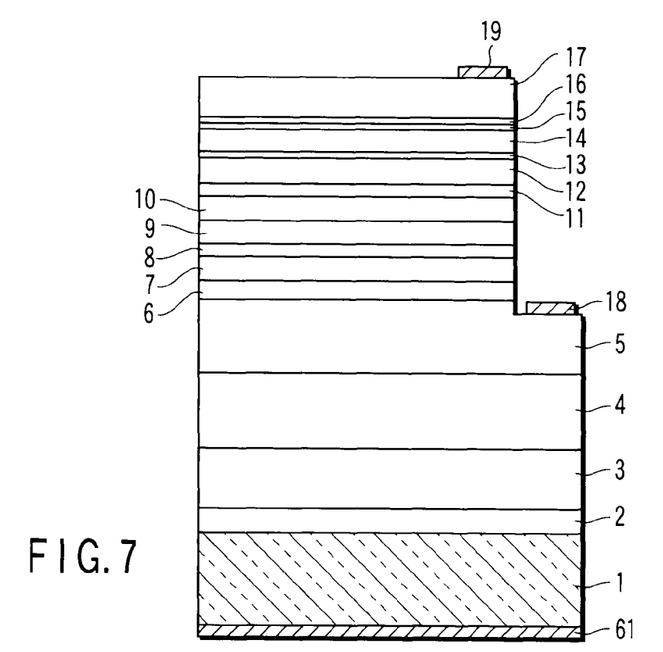
FIG. 7 is a cross-sectional view showing a configuration of a light emitting device according to a fifth embodiment of the present invention.

FIG. 7 is a cross-sectional view showing a configuration of a light emitting device according to a fifth embodiment of the present invention. Like reference numerals denote parts equal to those in FIG. 1. As shown in this drawing, the light emitting device according to this embodiment is a light emitting diode constituted of a GaN-based compound semiconductor formed on a sapphire substrate. A difference from the light emitting diode shown in FIG. 1 lies in that a reflection layer is provided on a rear surface of the sapphire substrate.

As shown in FIG. 7, in the light emitting diode according to this embodiment, a reflection film 61 is formed on a rear surface of a sapphire substrate 1. This reflection film 61 is formed of, e.g., aluminum, silver, nickel or the like. Implementation of the light emitting diode is performed in such a manner that the reflection film 61 is positioned on a bottom portion of a package. The reflection film 61 can be fixed to the package 31 by adopting an adhesive bonding, soldering or the like.

According to the light emitting diode of this embodiment, the same effects as those of the first embodiment can be obtained, and a white LED can be configured by combining this light emitting diode with a fluorescent substance like the second and third embodiments. Further, the reflection film 61 serves as the reflection film 32 in the second embodiment as it is, thereby facilitating implementation as an LED.

It is to be noted that the reflection film 61 can be fixed on the bottom surface of the package 31 with the reflection film 32 therebetween in the second embodiment. In this case, soldering or the like can be used for fixation.

Sixth Embodiment

Figure 8:
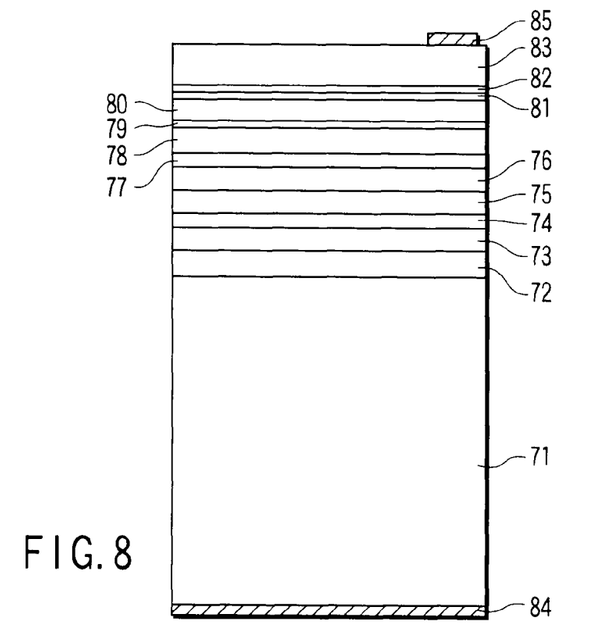
FIG. 8 is a cross-sectional view showing a configuration of a light emitting device according to a sixth embodiment of the present invention.

FIG. 8 is a cross-sectional view showing a configuration of a light emitting device according to a sixth embodiment of the present invention. As shown in the drawing, the light emitting device according to this embodiment is a light emitting diode constituted of a GaN-based compound semiconductor formed on a GaN substrate.

As shown in FIG. 8, on an Si-doped n type low-resistance GaN substrate 71 (Si concentration: $3\times10^{18}/cm^3$, film thickness: 100 μm) having a surface formed of a c surface having a Ga polarity are sequentially laminated an Si-doped n type $Al_{0.05}Ga_{0.95}N$ first confinement layer 72 (Si concentration: $1\times10^{18}/cm^3$, film thickness: 20 nm), an Si-doped n type GaN first absorption layer 73 (Si concentration: $1\times10^{18}/cm^3$, film thickness: 100 nm), an Si-doped n type GaInN photo-excited blue light emission layer 74 (Si concentration: $6\times10^{18}/cm^3$, film thickness: 2 nm, wavelength: 440 nm), an Si-doped n type GaN second absorption layer 75 (Si concentration: $1\times10^{18}/cm^3$, film thickness: 100 nm), an Si-doped n type $Al_{0.11}Ga_{0.89}N$ second confinement layer 76 (Si concentration: $1\times10^{18}/cm^3$, film thickness: 20 nm), an Si-doped n type $Al_{0.06}Ga_{0.94}N$ ultraviolet emission layer 77 (Si concentration: $1\times10^{18}/cm^3$, film thickness: 3 nm, a wavelength: 345 nm), a non-doped $Al_{0.11}Ga_{0.89}N$ spacer layer 78 (film thickness: 20 nm), an Mg-doped p type $Al_{0.28}Ga_{0.72}N$ electron barrier layer 79 (Mg concentration: $1\times10^{19}/cm^3$, film thickness: 100 nm), an Mg-doped p type $Al_{0.11}Ga_{0.89}N$ contact layer 80 (Mg concentration: $1\times10^{19}/cm^3$, film thickness: 100 nm), a high-concentration Mg-doped p type $Al_{0.11}Ga_{0.89}N$ contact layer 81 (Mg concentration: $2\times10^{20}/cm^3$, film thickness: 20 nm), a high-concentration Si-doped n type $Al_{0.11}Ga_{0.89}N$ contact layer 82 (Si concentration: $1\times10^{20}/cm^3$, film thickness: 20 nm) and an Si-doped n type $Al_{0.11}Ga_{0.89}N$ contact layer 83 (Si concentration: $5\times10^{18}/cm^3$, film thickness: 100 nm). The p type $Al_{0.11}Ga_{0.89}N$ contact layer 81 and the n type $Al_{0.11}Ga_{0.89}N$ contact layer 82 are layers which reduce a resistance like the first embodiment.

An n-side electrode 84 constituted of a composite film obtained by sequentially depositing Ti (0.05 μm)/Pt (0.05 μm)/Au (1.0 μm) is formed on a rear surface of the n type low-resistance GaN substrate 71. A p-side electrode 85 constituted of a composite film obtained by sequentially depositing Ti (0.05 μm)/Pt (0.05 μm)/Au (1.0 μm) is likewise formed on an upper surface of a part of the Si-doped n type $Al_{0.11}Ga_{0.89}N$ contact layer 83.

In the light emitting diode according to this embodiment, like the first embodiment, electrons are injected into the $Al_{0.06}Ga_{0.94}N$ ultraviolet emission layer 77 from the n type $Al_{0.11}Ga_{0.89}N$ second confinement layer 76, holes are injected into the same from the Mg-doped p type $Al_{0.28}Ga_{0.72}N$ electron barrier layer 79 through the $Al_{0.11}Ga_{0.89}N$ spacer layer 78, and ultraviolet light having a wavelength of 345 nm is emitted from the $Al_{0.06}Ga_{0.94}N$ ultraviolet emission layer 77. The ultraviolet light emitted to the p-side electrode 85 side is transmitted through the respective layers from the $Al_{0.11}Ga_{0.89}N$ spacer layer 78 to the Si-doped n type $Al_{0.11}Ga_{0.89}N$ contact layer 83 and efficiently emitted to the outside. That is because a forbidden bandwidth of each of these layers is larger than an energy corresponding to the wavelength of the emitted ultraviolet light.

On the other hand, the ultraviolet light emitted toward the substrate 71 side is absorbed in the Si-doped n type GaN second absorption layer 75 and the Si-doped n type GaN first absorption layer 73, and generated electrons and holes are recombined in the Si-doped n type GaInN photo-excited blue light emission layer 74, thereby emitting blue light of 440 nm. Since this light has an energy smaller than a forbidden bandwidth of GaN, it is efficiently taken out to the outside from the n type low-resistance GaN substrate 71 without being absorbed in this substrate 71 or the like. This light is also emitted toward the p-side electrode 85 side, transmitted through the respective layers from the Si-doped n type GaN second absorption layer 75 to the n type $Al_{0.11}Ga_{0.89}N$ contact layer 83 without being absorbed, and efficiently emitted to the outside.

As a total film thickness of the n type GaN first absorption layer 73 and the n type GaN second absorption layer 75, 0.1 to 0.5 μm is appropriate considering a trade-off of absorption efficiency and a loss of an excitation carrier, and a configuration in which the absorbing portion and the light emitting portion are separated can reduce a film thickness of the GaInN light emission layer like the first embodiment. When the film thickness is reduced in this manner, an influence of a piezoelectric field induced by strain can be alleviated, and a reduction in mobility of the carrier due to alloy scattering becomes prominent, which decreases a defect capturing speed. Therefore, non-light-emission recombination due to a crystal defect can be suppressed. Therefore, high light emission efficiency can be obtained.

As described above, according to the light emitting diode of this embodiment, ultraviolet light having a short wavelength which is not greater than 350 nm can be efficiently taken out to the outside, and the red fluorescent substance mentioned in conjunction with the first embodiment can be efficiently excited, thereby improving light emission efficiency of red visible light. Further, the blue light of 440 nm generated in the Si-doped n type GaInN photo-excited blue light emission layer 74 is emitted toward the substrate 71 side or the p-side electrode 85 side, and this light can be also effectively utilized. For example, this light can be utilized to excite a fluorescent substance which generates visible light having a color other than a red color, thereby efficiently obtaining the visible light having a color other than the red color. White color light or lights having any other various colors can be obtained by combining the light emitting device according to this embodiment with the red fluorescent substance or fluorescent substances having any other colors.

Furthermore, since the n type low-resistance GaN substrate 71 having electroconductivity is used as a substrate, an electrode forming process can be facilitated, and mounting in the package also becomes easy. Moreover, the n-side electrode 84 provided on the rear surface of the n type low-resistance GaN substrate 71 also functions to reflect the blue light of 440 nm generated in the Si-doped n type GaInN photo-excited blue light emission layer 74, whereby this blue light can be effectively exploited and a process of forming the reflection film on the inner surface of the package can be simplified.

As a manufacturing method of the light emitting diode of this embodiment, the method described in conjunction with the first embodiment can be used. That is, a GaN substrate manufactured by thick-film growth utilizing hydride vapor phase epitaxy is used as the n type low-resistance GaN substrate 71, and an element structure portion (the respective layers from the n type $Al_{0.05}Ga_{0.95}N$ first confinement layer 72 to the n type $Al_{0.11}Ga_{0.89}N$ contact layer 83) of the light emitting diode is grown on this GaN substrate like the first embodiment. As the manufacturing method of the GaN substrate using the hydride vapor phase epitaxy, it is possible to use a method which uses gallium chloride and ammonia as source gases to perform film formation of a GaN layer on a substrate consisting of sapphire or the like under conditions of an atmosphere pressure and approximately 1000° C.

Seventh Embodiment

Figure 9:
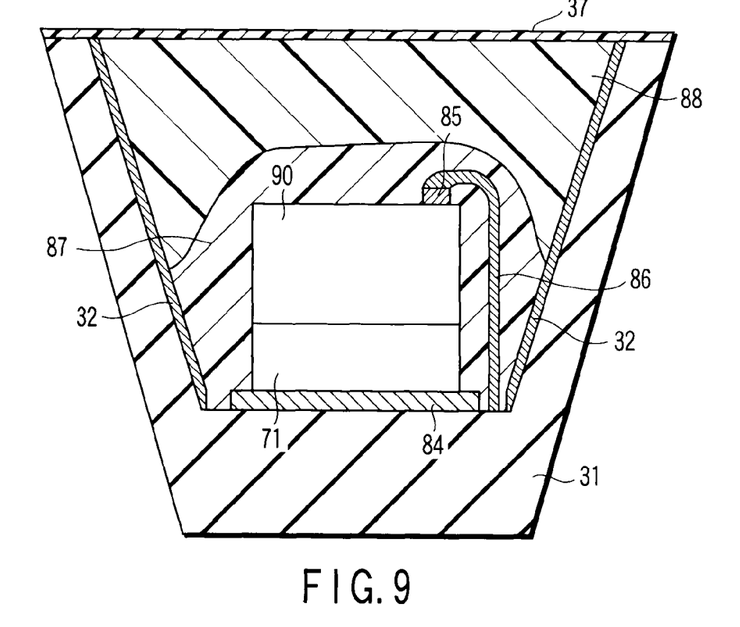
FIG. 9 is a cross-sectional view showing a configuration of a light emitting device according to a seventh embodiment of the present invention.

FIG. 9 is a cross-sectional view showing a configuration of a light emitting device according to a seventh embodiment of the present invention. Like reference numerals denote parts equal to those in FIG. 4. As shown in this drawing, the light emitting device according to this embodiment is a white LED obtained by combining the light emitting diode shown in FIG. 8 according to the sixth embodiment with a fluorescent substance. That is, as shown in FIG. 9, a reflection film 32 is provided on an inner side surface of a package 31, and the light emitting diode depicted in FIG. 7 is mounted on a bottom surface of the package 31 in such a manner that its n-side electrode 84 faces this bottom surface. Reference numeral 90 denotes an element structure portion.

The n-side electrode 84 is connected with a non-illustrated electrode provided on the bottom surface of the package 31, and a p-side electrode 85 is connected with a non-illustrated electrode provided on the package 31 side through a bonding wire 86 consisting of a gold alloy or the like. This connection is achieved at a part between the reflection film 32 on the inner side surface and the n-side electrode 84 on the bottom surface. Further, a fluorescent substance region 87 containing a red fluorescent substance is formed to cover the light emitting diode or the bonding wire 84, and a fluorescent substance region 88 containing a fluorescent substance having a blue color, a green color or a yellow color is formed on this fluorescent substance region 87. A lid portion 37 is provided on this fluorescent substance region 88. As materials of the fluorescent substance regions 87 and 88, it is possible to use the materials described in the second embodiment.

According to the light emitting diode of this embodiment, ultraviolet light of 345 nm emitted toward the p-side electrode 85 side efficiently excites the fluorescent substance having trivalent Eu or the like an emission center which is contained in the fluorescent substance layer 87, and is converted into light having a narrow wavelength distribution in the vicinity of 620 nm. That is, the ultraviolet light having a short wavelength which is not greater than 350 nm can efficiently obtain red visible light.

Furthermore, blue light of 440 nm generated in the Si-doped n type GaInN photo-excited blue light emission layer 74 is emitted toward the substrate 71 side or the p-side electrode 85 side. This light can be also effectively utilized by using reflection on the n-side electrode 84. That is, this blue light of 440 nm can efficiently excite the fluorescent substance having a green color or a yellow color contained in the fluorescent substance layer 88, thereby efficiently acquiring visible light having a green color or a yellow color.

Therefore, it is possible to efficiently generate the red visible light, the blue light of 440 nm and the visible light having the green color or the yellow color, and white light or lights having any other various colors can be efficiently obtained with excellent color rendering as a result of mixing these lights.

Eighth Embodiment

Figure 10:
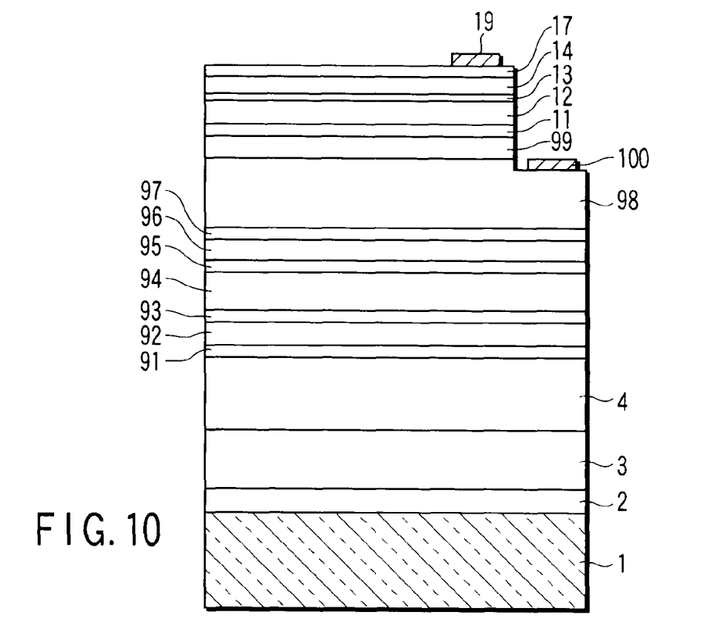
FIG. 10 is a cross-sectional view showing a configuration of a light emitting device according to an eighth embodiment of the present invention.

FIG. 10 is a cross-sectional view showing a configuration of a light emitting device according to an eighth embodiment of the present invention. Like reference numerals denote parts equal to those in FIG. 1. As shown in this drawing, the light emitting device according to this embodiment is a light emitting diode constituted of a GaN-based compound semiconductor formed on a sapphire substrate. A difference from the light emitting diode shown in FIG. 1 lies in that a contact layer on which an n-side electrode is provided is disposed between a current-injected ultraviolet emission layer and a photo-excited near-ultraviolet emission layer.

As shown in FIG. 10, in the light emitting device according to this embodiment, on a non-doped GaN buffer layer 4 are sequentially laminated an $Al_{0.05}Ga_{0.95}N$ first confinement layer 91 (film thickness: 20 nm), a GaN first absorption layer 92 (film thickness: 50 nm), an Si-doped n type GaInN first photo-excited near-ultraviolet emission layer 93 (Si concentration: $1\times10^{18}/cm^3$, film thickness: 3 nm, wavelength: 380 nm), a GaN second absorption layer 94 (film thickness: 100 nm), an Si-doped n type GaInN second photo-excited near-ultraviolet emission layer 95 (Si concentration: $1\times10^{18}/cm^3$, film thickness: 3 nm, wavelength: 380 nm), a GaN third absorption layer 96 (film thickness: 50 nm), an $Al_{0.11}Ga_{0.89}N$ first confinement layer 97 (film thickness: 20 nm), an Si-doped n type $Al_{0.10}Ga_{0.90}N$ contact layer 98 (Si concentration: $5\times10^{18}/cm^3$, film thickness: 1.5 μm) and a non-doped $Al_{0.11}Ga_{0.89}N$ spacer layer 99 (film thickness: 20 nm).

Furthermore, on the $Al_{0.11}Ga_{0.89}N$ spacer layer 99 are sequentially laminated an Si-doped n type $Al_{0.06}Ga_{0.94}N$ current-injected ultraviolet emission layer 11, an $Al_{0.11}Ga_{0.89}N$ spacer layer 12, an Mg-doped p type $Al_{0.28}Ga_{0.72}N$ electron barrier layer 13, an Mg-doped p type $Al_{0.11}Ga_{0.89}N$ contact layer 14 and an Si-doped n type $Al_{0.11}Ga_{0.89}N$ contact layer 17. Moreover, an n-side electrode 100 is provided on the Si-doped n type $Al_{0.10}Ga_{0.90}N$ contact layer 98.

It is to be noted that, in this embodiment, the Mg-doped p type $Al_{0.11}Ga_{0.89}N$ contact layer 14 is directly in contact with the Si-doped n type $Al_{0.11}Ga_{0.89}N$ contact layer 17, and a high-concentration Mg-doped p type $Al_{0.11}Ga_{0.89}N$ contact layer 15 and a high-concentration Si-doped n type $Al_{0.11}Ga_{0.89}N$ contact layer 16 are not interposed between these layers. Although a structure in which these contact layers 15 and 16 exist is desirable since a resistance can be effectively reduced, the contact layers 15 and 16 can be eliminated by increasing concentrations of the contact layers 14 and 17 as required in accordance with a demanded resistance value.

In the light emitting diode according to this embodiment, electrons are injected into the $Al_{0.06}Ga_{0.94}N$ current-injected ultraviolet emission layer 11 from the Si-doped n type $Al_{0.10}Ga_{0.90}N$ contact layer 98 through the $Al_{0.11}Ga_{0.89}N$ spacer layer 99, holes are injected into the same from the Mg-doped p type $Al_{0.28}Ga_{0.72}N$ electron barrier layer 13 through the $Al_{0.11}Ga_{0.89}N$ spacer layer 12, and ultraviolet light having a wavelength of 345 nm is emitted from the $Al_{0.06}Ga_{0.94}N$ current-injected ultraviolet emission layer 11 like the first embodiment. The ultraviolet light emitted toward the p-side electrode 19 side is transmitted through the respective layers from the $Al_{0.11}Ga_{0.89}N$ spacer layer 12 to the Si-doped n type $Al_{0.11}Ga_{0.89}N$ contact layer 17, and efficiently emitted to the outside.

On the other hand, the ultraviolet light emitted toward the substrate 1 side is absorbed in the Si-doped n type GaN third absorption layer 96, the Si-doped n type GaN second absorption layer 94 and the Si-doped n type GaN first absorption layer 92, and generated electrons and holes are recombined in the Si-doped n type GaInN second photo-excited near-ultraviolet emission layer 95 and the Si-doped n type GaInN first photo-excited near-ultraviolet emission layer 93, thereby emitting light of 380 nm. Since this light has an energy smaller than a forbidden bandwidth of GaN, it is efficiently taken out to the outside from the substrate 1 without being absorbed in the non-doped GaN buffer layer 4 or the like. This light is also emitted toward the p-side electrode 19 side, transmitted through the respective layers from the Si-doped n type GaN second absorption layer 94 to the n type $Al_{0.11}Ga_{0.89}N$ contact layer 17 without being absorbed, and efficiently emitted to the outside.

As described above, according to the light emitting diode of this embodiment, the same effects as those of the first embodiment can be obtained, and the following effects can be demonstrated. That is, since electrons are injected into the $Al_{0.06}Ga_{0.94}N$ current-injected ultraviolet emission layer 11 from the Si-doped n type $Al_{0.10}Ga_{0.90}N$ contact layer 98 through the $Al_{0.11}Ga_{0.89}N$ spacer layer 99, a current does not have to flow through the respective layers below the Si-doped n type $Al_{0.11}Ga_{0.89}N$ first confinement layer 97. Therefore, it is not necessary to dope Si in these layers to provide n type layers. Si is not doped in the GaN second absorption layer 92, 94 or 96, or a doping amount is very small even if Si is doped. As a result, it is possible to prevent light having a wavelength corresponding to a GaN forbidden bandwidth from being generated in the absorption layer 92, 94 or 96. When the light having a wavelength corresponding to the GaN forbidden bandwidth is generated, it is absorbed in the non-doped GaN buffer layer 4 or the like as described above, whereby efficiency is lowered. Based on this, light having a wavelength of 380 nm can be efficiently generated from the Si-doped n type GaInN second photo-excited near-ultraviolet emission layer 95 and the Si-doped n type GaInN first photo-excited near-ultraviolet emission layer 93.

Ninth Embodiment

Figure 11:
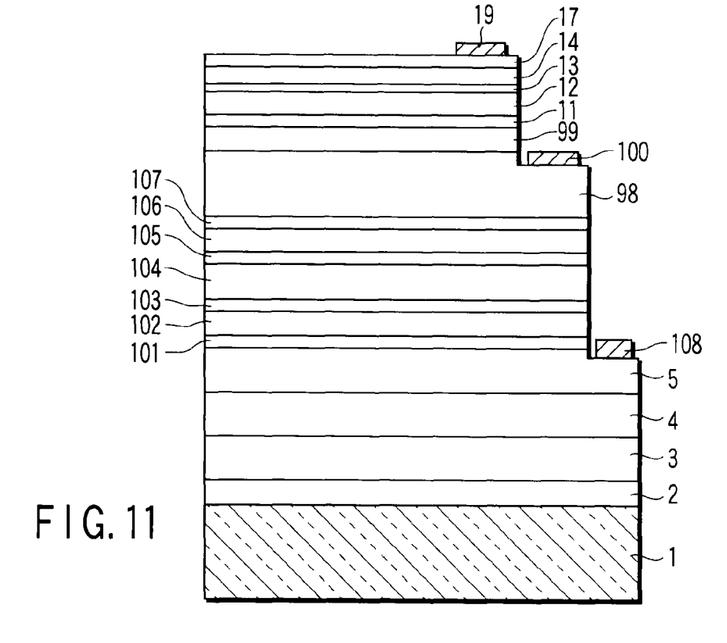
FIG. 11 is a cross-sectional view showing a configuration of a light emitting device according to a ninth embodiment of the present invention.

FIG. 11 is a cross-sectional view showing a configuration of a light emitting diode according to a ninth embodiment of the present invention. Like reference numerals denote parts equal to those in FIGS. 1 and 10. As shown in this drawing, the light emitting device according to this embodiment is a light emitting diode constituted of a GaN-based compound semiconductor formed on a sapphire substrate. A difference from the light emitting diode shown in FIG. 1 lies in that a contact layer on which an n-side electrode is provided is additionally provided between a current-injected ultraviolet emission layer and a photo-excited near-ultraviolet emission layer.

As shown in FIG. 11, in the light emitting device according to this embodiment, on an Si-doped n type GaN contact layer 5 are sequentially laminated an Si-doped n type $Al_{0.05}Ga_{0.95}N$ first confinement layer 101 (Si concentration: $1\times10^{18}/cm^3$, film thickness: 20 nm), an Si-doped n type GaN first absorption layer 102 (Si concentration: $1\times10^{18}/cm^3$, film thickness: 50 nm), an Si-doped n type GaInN first photo-excited near-ultraviolet emission layer 103 (Si concentration: $1\times10^{18}/cm^3$, film thickness: 3 nm, wavelength: 380 nm), an Si-doped n type GaN second absorption layer 104 (Si concentration: $1\times10^{18}/cm^3$, film thickness: 100 nm), an Si-doped n type GaInN second photo-excited near-ultraviolet emission layer 105 (Si concentration: $1\times10^{18}/cm^3$, film thickness: 3 nm, wavelength: 380 nm), an Si-doped n type GaN third absorption layer 106 (Si concentration: $1\times10^{18}/cm^3$, film thickness: 50 nm) and an Si-doped n type $Al_{0.11}Ga_{0.89}N$ second confinement layer 107 (Si concentration: $1 \times 10^{18}/cm^3$, film thickness: 20 nm). On the n type $Al_{0.11}Ga_{0.89}N$ second confinement layer 107 are sequentially laminated respective layers from an Si-doped n type $Al_{0.10}Ga_{0.90}N$ contact layer 98 to an Si-doped n type $Al_{0.11}Ga_{0.89}N$ contact layer 17 like the eighth embodiment.

Moreover, an n-side electrode 108 is provided on the Si-doped n type GaN contact layer 5, and this electrode, an intermediate electrode 100 on the Si-doped n type $Al_{0.10}Ga_{0.90}N$ contact layer 98 and a p-side electrode 19 on the n type $Al_{0.11}Ga_{0.89}N$ contact layer 17 form a three-terminal electrode. When a voltage is applied to a part between the p-side electrode 19 and the intermediate electrode 100 and a part between the n-side electrode 108 and the intermediate electrode 100, a current can be supplied to each of the $Al_{0.06}Ga_{0.94}N$ current-injected ultraviolet emission layer 11, the Si-doped n type GaInN second photo-excited near-ultraviolet emission layer 105 and the Si-doped n type GaInN first photo-excited near-ultraviolet emission layer 103.

In the light emitting diode according to this embodiment, like the eighth embodiment, ultraviolet light having a wavelength of 345 nm is emitted from the $Al_{0.06}Ga_{0.94}N$ ultraviolet emission layer 11, and the ultraviolet light emitted toward the p-side electrode 19 side is transmitted through the respective layers from the $Al_{0.11}Ga_{0.89}N$ spacer layer 12 to the Si-doped n type $Al_{0.11}Ga_{0.89}N$ contact layer 17 and efficiently emitted to the outside.

On the other hand, the ultraviolet light emitted toward the substrate 1 side is absorbed in the Si-doped n type GaN third absorption layer 106, the Si-doped n type GaN second absorption layer 104 and the Si-doped n type GaN first absorption layer 102, and generated electrons and holes are recombined in the Si-doped n type GaInN second photo-excited near-ultraviolet emission layer 105 and the Si-doped n type GaInN first photo-excited near-ultraviolet emission layer 103, thereby emitting light of 380 nm. Since this light has an energy smaller than a forbidden bandwidth of GaN, it is efficiently taken out to the outside from the substrate 1 without being absorbed in the non-doped GaN buffer layer 4, the Si-doped n type GaN contact layer 5 or the like. This light is also emitted toward the p-side electrode 19 side, transmitted through the respective layers from the Si-doped n type GaN second absorption layer 104 to the n type $Al_{0.11}Ga_{0.89}N$ contact layer 17 without being absorbed and efficiently emitted to the outside.

As described above, according to the light emitting diode of this embodiment, the same effects as those of the first embodiment can be obtained, and the following effects can be demonstrated. That is, since an electric field is not applied to the photo-excited near-ultraviolet emission layer portion in the configuration according to this embodiment, a force which separates electrons from holes does not act, and hence high efficiency can be expected.

It is to be noted that the present invention is not restricted to the foregoing embodiments. For example, the fluorescent substance region containing the red fluorescent substance and the fluorescent substance region containing the fluorescent substance of the blue color, the green color or the yellow color are separately formed in the foregoing embodiments, but it is possible to use a fluorescent substance region in which the red fluorescent substance and the fluorescent substance of the blue color, the green color or the yellow color are mixed together. In this case, the number of the fluorescent substance regions can be reduced, thereby simplifying the manufacturing steps. Additionally, a fluorescent substance selected from the fluorescent substances of the blue color, the green color and the yellow color can be mixed with the red fluorescent substance to constitute one fluorescent substance layer, and this fluorescent substance layer and a fluorescent substance region containing another fluorescent substance selected from the fluorescent substances of the blue color, the green color and the yellow color can be laminated.

Further, as the transparent substrate, it is possible to use a sapphire substrate, a GaN substrate, an SiC substrate or a substrate formed of any other material. Furthermore, a multiple quantum well can be used for a light emission layer, or modulation doping can be used for an impurity-doped portion.

According to the present invention, since a light emitting diode and a fluorescent substance can be used to provide a light emitting device having excellent efficiency and color rendering, substitution is possible in a field where a white fluorescent lamp has been conventionally used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A light emitting device comprising:
   a light emitting diode, including
   a transparent substrate having a first surface and a second surface;
   a semiconductor layer provided on the first surface of the transparent substrate;
   a first light emission layer which is provided on the semiconductor layer and emits first ultraviolet light including a wavelength corresponding to an energy larger than a forbidden bandwidth of a semiconductor of the semiconductor layer;
   a second light emission layer which is provided between the first light emission layer and the semiconductor layer, absorbs the first ultraviolet light emitted from the first light emission layer, and emits second ultraviolet light including a wavelength corresponding to an energy smaller than the forbidden bandwidth of the semiconductor of the semiconductor layer;
   a first electrode and a second electrode provided in order to apply electric power to the first light emission layer; and
   a first fluorescent substance member region formed so as to cover upper and side surfaces of the light emitting diode and containing a first fluorescent substance which is excited by the first ultraviolet light to emit light having a first wavelength;
   a second fluorescent substance member region provided on the first fluorescent member region and containing a second fluorescent member which is excited by the second ultraviolet light to emit light having a second wavelength, the first wavelength being longer than the second wavelength; and
   a third fluorescent substance region provided below the light emitting diode, the third fluorescent substance region containing a third fluorescent member which is excited by the second ultraviolet light to emit light having a third wavelength.

2. The light emitting device according to claim 1, wherein the first fluorescent substance is a red fluorescent substance having trivalent Eu as an emission center.

3. The light emitting device according to claim 1, wherein the first wavelength is longer than the third wavelength.

4. The light emitting device according to claim 1, further comprising a reflection film below the third fluorescent substance region.

* * * * *